US006896096B2

(12) United States Patent
Nevill et al.

(10) Patent No.: US 6,896,096 B2
(45) Date of Patent: May 24, 2005

(54) ACOUSTIC STRUCTURES

(75) Inventors: Stuart Michael Nevill, Kent (GB); Morten Villiers Warren, London (GB)

(73) Assignee: B&W Loudspeakers Limited, Worthing (GB)

( * ) Notice: Subject to any disclaimer, the term of this patent is extended or adjusted under 35 U.S.C. 154(b) by 0 days.

(21) Appl. No.: 10/333,203

(22) PCT Filed: Jul. 21, 2001

(86) PCT No.: PCT/GB01/03249

§ 371 (c)(1), (2), (4) Date: May 5, 2003

(87) PCT Pub. No.: WO02/09486

PCT Pub. Date: Jan. 31, 2002

(65) Prior Publication Data

US 2003/0161495 A1 Aug. 28, 2003

(30) Foreign Application Priority Data

Jul. 21, 2000 (GB) ............................................ 0017995

(51) Int. Cl.[7] .......................... A47B 81/06; H05K 5/02; H05K 5/00; H04R 1/02

(52) U.S. Cl. ........................ 181/199; 181/148; 381/345

(58) Field of Search ................................ 181/199, 292, 181/148, 156, 183, 155; 381/345, 349, 386, 395

(56) References Cited

U.S. PATENT DOCUMENTS

| | | | | |
|---|---|---|---|---|
| 2,031,500 A | | 2/1936 | Olney | |
| 2,866,514 A | | 12/1958 | Weathers | |
| 2,917,127 A | | 12/1959 | Elliott | |
| 3,696,886 A | | 10/1972 | Armstrong | |
| 3,953,675 A | * | 4/1976 | Babb | 181/148 |
| 4,054,748 A | | 10/1977 | Balogh | |
| 4,168,761 A | | 9/1979 | Pappanikolaou | |
| 4,283,606 A | | 8/1981 | Buck | |
| 4,690,244 A | * | 9/1987 | Dickie | 181/146 |
| 5,923,003 A | * | 7/1999 | Arcas et al. | 181/292 |
| D453,016 S | * | 1/2002 | Nevill et al. | D14/214 |

FOREIGN PATENT DOCUMENTS

| | | | | |
|---|---|---|---|---|
| EP | 0 155 034 A2 | | 2/1985 | |
| EP | 0 352 993 B1 | | 1/1990 | |
| EP | 0 352 993 A1 | | 1/1990 | |
| EP | 0 489 551 A2 | | 6/1992 | |
| EP | 0 553 499 A2 | | 8/1993 | |
| EP | 0 565 369 A2 | | 10/1993 | |
| FR | 2 653 630 A1 | | 4/1991 | |
| FR | 2 688 971 A1 | | 9/1993 | |
| GB | 483745 | | 4/1938 | |
| GB | 590541 | | 7/1947 | |
| GB | 656732 | | 8/1951 | |
| GB | 2 054 323 A | | 2/1981 | |
| GB | 2 184 323 A | | 6/1987 | |
| GB | 2368484 A | * | 5/2002 | H04R/1/24 |
| GB | 2380091 A | * | 3/2003 | H04R/1/20 |
| JP | 57-155894 | | 9/1982 | |
| WO | 93/12637 | | 6/1993 | |
| WO | 98/26630 | | 6/1998 | |

* cited by examiner

*Primary Examiner*—Edgardo San Martin
(74) *Attorney, Agent, or Firm*—Burns, Doane, Swecker & Mathis, L.L.P.

(57) ABSTRACT

An acoustic structure includes a first, rigid panel (7), a second, rigid panel (11) aligned in spaced, substantially parallel, relationship with the first panel (7), a multiplicity of partition walls (15) running transverse to the panels of the panels (7, 11) and dividing the interior space of the enclosures into a single layer of cells (17) bounded at one face by the inside of the first panel (7) and bounded at the opposite face by the inside of the second panel (11), the partition walls (15) being bonded at the one face to the inside of the first panel (7) and at the opposite face to the inside of the second panel (11), and a multiplicity of apertures (19) in the partition walls (15) providing communication between adjacent cells of the single layer of cells (17).

22 Claims, 4 Drawing Sheets

ACOUSTIC STRUCTURES

BACKGROUND

This invention relates to acoustic structures.

In recent years, so-called flat panel loudspeaker units (the term "loudspeaker unit" being used to mean the combination of at least one loudspeaker drive unit and a loudspeaker enclosure) have been introduced of which the overall depth is much reduced in comparison with a loudspeaker unit of traditional design. The reduced depth is possible because mid-range and bass loudspeaker drive units with a reduced front to back dimension have been developed.

It is, however, unfortunately true that savings of space in loudspeaker units and other acoustic apparatus for hi fi use generally involve a reduction in the quality of the sound produced by the apparatus.

It is an object of the invention to provide an acoustic structure which can provide improved sound quality in acoustic apparatus of relatively small physical size.

BRIEF SUMMARY

The present invention provides an acoustic structure comprising:

- a first rigid panel,
- a second rigid panel aligned in spaced, substantially parallel, relationship with the first panel,
- a multiplicity of partition walls running transverse to the planes of the panels and dividing the interior space of the enclosure into a single layer of cells bounded at one face by the inside of the first panel and bounded at the opposite face by the inside of the second panel, the partition walls being bonded at the one face to the inside of the first panel and at the opposite face to the inside of the second panel, and
- a multiplicity of apertures in the partition walls providing communication between adjacent cells of the single layer of cells, and optionally in which:
- the cells each have a cross-sectional area parallel to the panels in the range 0.25 to 10 $cm^2$,
- the apertures each have a cross-sectional area of at least 0.04 $cm^2$, and
  - at least 55% of the wall between a cell and an adjoining cell is imperforate.

Such a structure especially with the dimensions given is capable of widespread usefulness in making hi fi acoustic apparatus such as loudspeaker enclosures, horn-type loudspeaker units, and labyrinth-type loudspeaker units. The structure with the dimensions defined above has a low-pass filter characteristic analogous to the lumped capacitance and inductance equivalent circuit of an electrical transmission line, the apertures in the partition walls act as small masses (analogous to inductors) and the cells act as small springs (analogous to capacitors). The overall effect is that sound is delayed in passing from cell to cell via the apertures and as result the acoustic structure can be provided as part of a horn, as part of a labyrinthine tube, and so on, to make the acoustic apparatus produce sound giving the impression to the ear that the acoustic apparatus is physically larger than in fact it actually is.

An acoustic structure according to the invention can also be used in making a loudspeaker enclosure, in which application it is highly advantageous because the resultant structure is very rigid although the filter properties of the structure may not necessarily be made use of in that application.

Thus, by means of an acoustic structure of the invention better sound reproduction can be achieved for a given size of acoustic apparatus. Fundamental tunings, such as the mass of a speaker cone bouncing on the bulk stiffness of the enclosed air of a loudspeaker enclosure, or the mass of the main tuning port or auxiliary bass radiator also bouncing on the stiffness of enclosed air can remain essentially unchanged but other system resonances dependent on transit times are affected beneficially.

An acoustic structure according to the invention may be produced as a product in its own right for insertion into acoustic apparatus, for example, into a loudspeaker enclosure or it may be produced during the making of acoustic apparatus so that the acoustic structure comes into being during the making of the acoustic apparatus. As an example of the former case, a block of the acoustic structure may be made, cut to shape and bonded to the interior of an acoustic apparatus. As an example of the latter case, a flat horn for a horn-type loudspeaker may be made by bonding a single layer of cells between two flat panels shaped to flare like a horn. Thus, the horn and the acoustic structure are produced at one and the same time.

Preferably, the panels are flat panels but, in principle, they may be of virtually any shape, for example, a curved or corrugated shape.

Preferably, the spacing of the first and second panels is in the range 10 to 50 millimetres, more preferably in the range 15 to 35 millimetres, and yet more preferably in the range 20 to 30 millimetres.

Preferably, the cells each have a cross-sectional area in the range 0.5 to 4 $cm^2$, more preferably a cross-sectional area in the range 0.6 to 2 $cm^2$, and yet more preferably a cross-sectional area in the range 0.8 to 1.5 $cm^2$.

Preferably, the apertures each have a cross-sectional area of at least 0.1 $cm^2$, more preferably in the range 0.15 to 0.25 $cm^2$.

Preferably, at least 60% of the wall between a cell and an adjoining cell is imperforate, more preferably, at least 70% of the wall between a cell and an adjoining cell is imperforate.

The diameter of the cells is preferably between 15 and 50 millimetres, more preferably between 20 and 30 millimetres. Such cell sizes give good acoustic results in a mid-range or bass loudspeaker system.

The above dimensions give good practical results at the frequencies used in hi fi apparatus.

Sound absorbent material may be provided within some or all of the cells.

The apertures may be in the form of slots at the edges of the partition walls. The slots may be at some or all of the edges of the partition walls but instead holes of virtually any shape may be provided virtually anywhere on the partition walls.

Advantageously, each cell has two walls parallel to each other defined by parts of the metal partition walls, and apertures are provided in the said two walls parallel to each other.

Preferably, the apertures are arranged in pairs, one aperture of each pair being adjacent the first panel and the other being adjacent the second panel.

Advantageously, the arrangement of the apertures is non-uniform. For example, apertures can be provided to a greater degree along a preferred axis of sound travel such as the long dimension of an enclosure or horn.

Preferably, the partition walls are formed by a multiplicity of inter-connected lamellae expanded into a network of cells. That feature makes manufacture particularly simple.

It is preferred that the panels are made of a material having a Young's modulus greater than 50 GPa. A high Young's modulus is particular advantageous when making a loudspeaker enclosure in order to obtain high rigidity.

It is also preferred that the partition walls are made of a material having a Young's modulus greater than 50 GPa.

Advantageously, the panels are made of glass. Glass is a material capable both of contributing great rigidity to the structure and of providing an aesthetically attractive finish. Clear glass may be used to give an interesting view into the interior of the structure. The glass may be, for example, between 2 and 10 millimetres thick, more preferably between 4 and 8 millimetres thick, and yet more preferably approximately 6 millimetres thick. Toughened glass may be used to increase physical safety. The glass may be laminated to provide both acoustic damping and physical safety.

The panels may instead be made of metal.

The panels and/or the partition walls may be made of aluminium. In that way, stiffness and lightness can be combined.

The metal panels may be between half a millimetre and two millimetres thick. That combines sufficiency of stiffness with economy of metal, and lightness and also avoids loss of internal volume.

Preferably, the partition walls are less than one tenth the thickness of the panels. By that means, good rigidity can be combined with economical use of material and lightness.

The cells are preferably polygonal. They may be hexagonal, based on either regular or elongated hexagons. Polygonal cells are easy to manufacture and hexagonal cells give particular rigidity.

Advantageously, the partition walls are adhesively bonded to the panels, preferably by means of an adhesive having low resilience when set, for example, an epoxy resin adhesive. That is a particularly simple manufacturing technique and the choice of a low resilience adhesive has an advantageous effect on sound quality although some resilience in the adhesive may be used for acoustic damping.

Advantageously, at least for some applications, at least three of said flat panels in spaced, substantially parallel relationship are provided, there being a respective single layer of cells between each adjacent pair of panels, the or each panel that lies between two adjacent layers of cells including a multiplicity of apertures providing communication between cells of the adjacent layers of cells. By that means, sounds can be delayed when passing from front to back, from side to side, and up and down in the structure. Labyrinthine, meandering and other sound routes can be defined by suitable placing of communication apertures.

The number of flat panels may be selected from the group consisting of 2, 3, 4, 4 or more, and 5 or more, flat panels.

Advantageously, an enclosure for a loudspeaker drive unit comprises a structure as claimed in any preceding claim, wherein one of the panels forms the front of the enclosure and has an opening therein for mounting a loudspeaker drive unit, a peripheral wall running about the periphery of the structure to enclose the space within the structure. It is of very great advantage from the point of view of sound reproduction that such a cellular enclosure construction is very stiff.

Preferably, the peripheral wall is made of metal.

The peripheral wall may be made of aluminium but it could instead be made of a plastics material. For example, plastics material moulded into a C-shaped cross-section and filled with foamed plastics or other material may be used.

The panels may be rectangular panels but many other shapes are possible.

The overall depth of the enclosure may be less than 50 millimetres, less than 40 millimetres, less than 30 millimetres, or less than 20 millimetres, or between 10 and 15 millimetres.

Each panel may have an overall area of between 500 and 4,000 square centimetres, or between 1,000 and 3,000 square centimetres.

BRIEF DESCRIPTION OF THE FIGURES

Acoustic apparatus including an acoustic structure in accordance with the invention will now be described, by way of example only, with reference to the accompanying drawing, in which.

DETAILED DESCRIPTION OF PREFERED EMBODIMENTS

Figure 1:
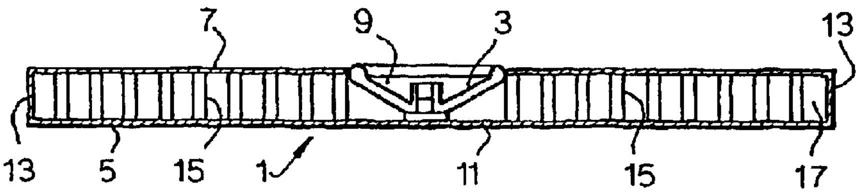
FIG. 1 is a diagrammatic cross-section through a flat panel loudspeaker unit.

Referring to the accompanying drawing, a loudspeaker unit 1 comprises a loudspeaker drive unit 3 of the modern reduced physical depth type mounted in an enclosure 5. The loudspeaker drive unit 3 can be either a mid-range or a bass unit. The enclosure 5 comprises a first, flat, metal panel 7 forming the front of the enclosure and having an opening 9 therein in which the loudspeaker drive unit 3 is mounted. The enclosure 5 further comprises a second, flat, metal panel 11 aligned in spaced, substantially parallel, relationship with the first metal panel 7 and forming the rear of the enclosure.

A peripheral wall 13 runs about the periphery of the first and second metal panels 7, 11 to enclose the space therebetween, the peripheral wall running transverse to the planes of the metal panels and being bonded at the front to the first metal panel and at the rear to the second metal panel. Epoxy resin is a suitable adhesive for securing the peripheral wall 13 in place.

A multiplicity of metal partition walls 15 run transverse to the planes of the metal panels 7, 11 and divide the interior space of the enclosure into a single layer of cells 17 bounded at the front by the inside of the first metal panel 7 and bounded at the rear by the inside of the second metal panel 11, the partition walls being bonded at the front to the inside of the first metal panel and at the rear to the inside of the second metal panel.

A multiplicity of apertures 19 (not shown in FIG. 1) in the metal partition walls 15 provide communication between adjacent cells of the single layer of cells 17.

Figure 2:
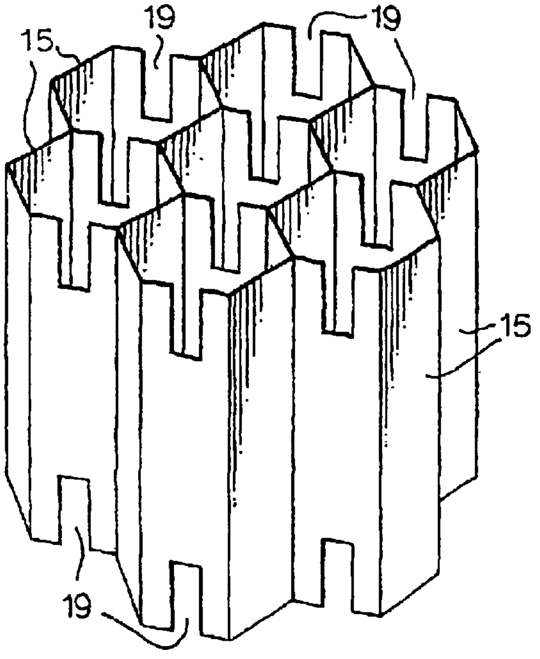
FIG. 2 shows a network of cells used in the enclosure of the loudspeaker unit.

The partition walls 15 are formed by a multiplicity of inter-connected lamellae expanded into a network of cells as shown schematically in FIG. 2. The expansion of the lamellae into a network of cells is analogous to the way in which paper Christmas directions can be opened up from a compressed state.

Both the panels 7 and 11 and the partition walls 15 are made of aluminium, the metal panels being approximately one millimetre thick and the partition walls being a little less than 0.1 millimetre in thickness.

As can be seen in FIG. 2, the cells are hexagonal, the hexagons being regular hexagons.

When constructing the enclosure 5, the partition walls 15 are adhesively bonded to the panels by means of an epoxy resin adhesive.

The peripheral wall 13 is also made of metal, namely, aluminium. It is in the form of a strip of metal of length corresponding to the periphery of the panels, bent to shape and bonded into place.

The panels 7 and 11 are rectangular panels and the overall depth of the enclosure is approximately 25 millimetres so that the system is a so-called "flat panel" system. The diameter of the cells (side to opposite side measurement) is approximately 25 millimetres.

If desired, sound absorbent material (not shown) can be provided within some or all of the cells of the layer of cells 17.

The apertures 19 are in the form of slots at the edges of the partition walls as shown in FIG. 2. The apertures can be provided in some or all sides of the cells so as to communicate in some or all directions with adjacent cells. As seen in FIG. 2, each cell has two walls 21 parallel to each other in which the apertures 19 are provided. As seen in FIG. 2, the apertures are arranged in pairs 23A, 23B, one aperture of each pair being at the front and the other being at the rear of the metal partition walls 15. Many other arrangements of apertures are, however, possible such as apertures in the central regions of the cell walls. Holes with dimensions which change with distance from a loudspeaker drive unit according to some desire law, for example, a logarithmic law can be provided.

The overall dimensions of the enclosure 5 are 650×300×25 millimetres approximately and thus each metal panel has an overall area of approximately 1,950 square centimetres.

The construction shown has the advantage that the distance from the speaker diaphragm to the rear of the enclosure is relatively short so that standing waves in that direction within the cells are not a problem (as they can be in known speakers of which the interior is divided into cells).

Instead of making the partition walls 13 separately from the panels 7 and 11, it is possible to form them integrally with one of the panels by die-casting and then to secure the remaining panel by adhesive bonding. In that case, the partition walls are integrally bonded to one panel and adhesively bonded to the other. The partition walls are not necessarily arranged normal to the panels but may be at an angle to them. For example, a single three-dimensional sheet of material having peaks and pits in the manner of a conventional egg tray can be used to create sloping partition walls. The pits which in an conventional egg tray would hold the eggs form the cells and the spaces between the peaks form the apertures between cells. Apertures could be provided connecting one side of the single sheet to the other.

If desired, one or more reflex ports or one or more ABRs (auxiliary bass radiators) can be included in one of the panels. The ABRs may be of conventional form or as described in our specification WO 00/32010.

The peripheral wall can, if desired, be formed by the outermost part of the partition walls rather than being a separate component in its own right.

Figure 3:
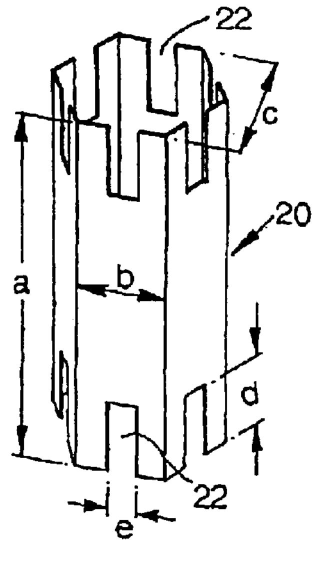
FIG. 3 is a diagrammatic illustration of a single cell identifying its dimensions.

The acoustic effects of the structure depend upon the dimensioning of the cells and apertures. FIG. 3 shows a single cell 20 with especially advantageous dimensions for creating the delay effect intended when the cells of the structure conform to these dimensions. FIG. 3 also shows that the placing of apertures 22 does not necessarily have to be uniform. The marked dimensions identified by letters are as follows:

| dimension | millimeters |
|---|---|
| a | 25 |
| b | 6 |
| c | 10 |
| d | 5 |
| e | 4 |

Figure 4:
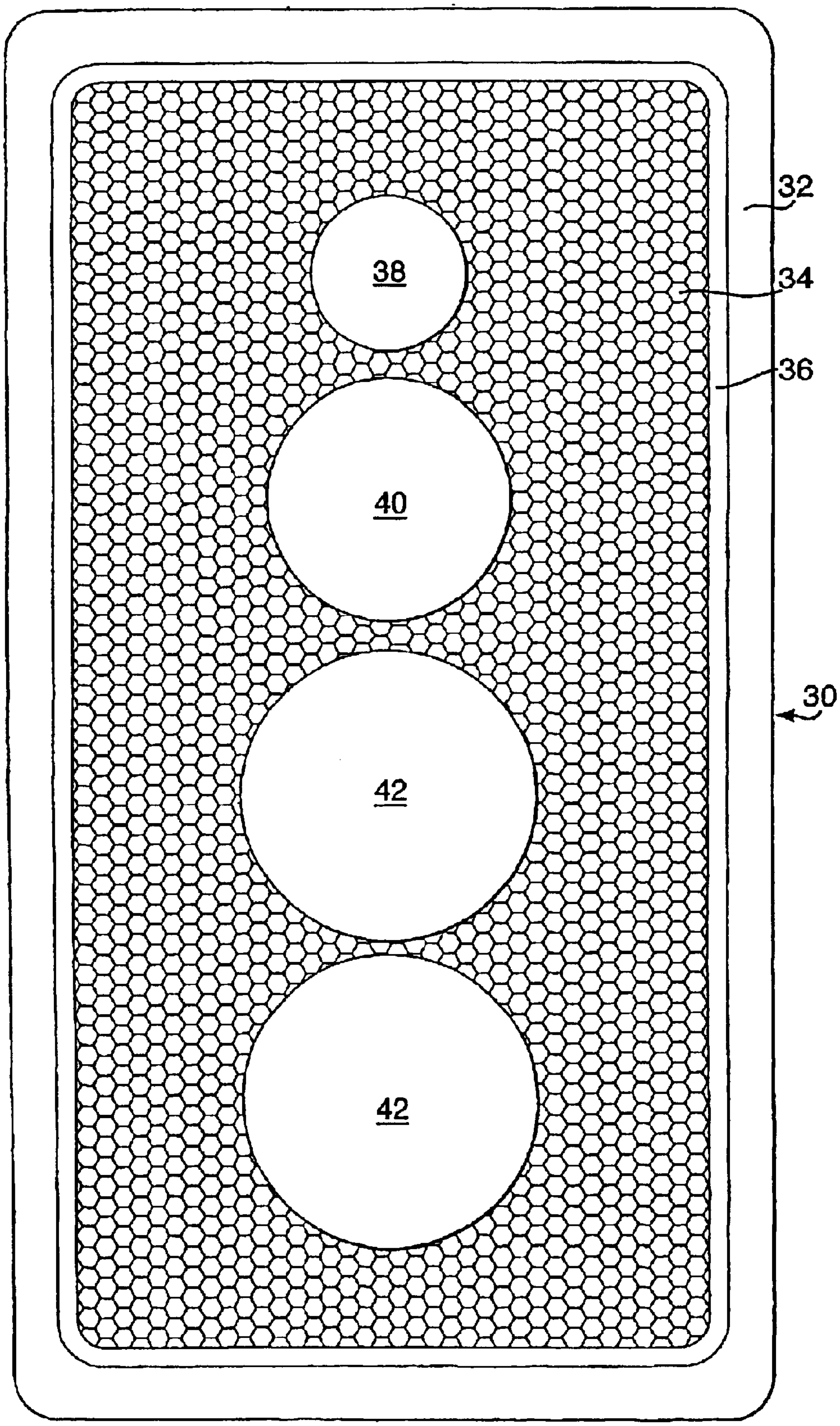
FIG. 4 is a front view of a second flat panel loudspeaker unit.

FIG. 4 shows a flat panel type loudspeaker unit 30 comprising two rectangular panels of transparent glass 32 (only one is visible in the drawing), a single layer of hexagonal cells 34 sandwiched between the panels and bonded to them, a peripheral wall 36 about the cells and bonded to the panels, a tweeter drive unit 38, a midrange drive unit 40, and two bass drive units 42. The units 40 and 42 are again of the modern reduced depth type (the tweeter drive unit 38 being of ordinary construction and having relatively little depth). The loudspeaker unit 30 in general construction corresponds to what has already been described with reference to FIGS. 1, 2 and 3 but includes more loudspeaker drive units and is of see-through construction. If desired, one or more of the loudspeaker units could be replaced by an ABR.

Figure 5:
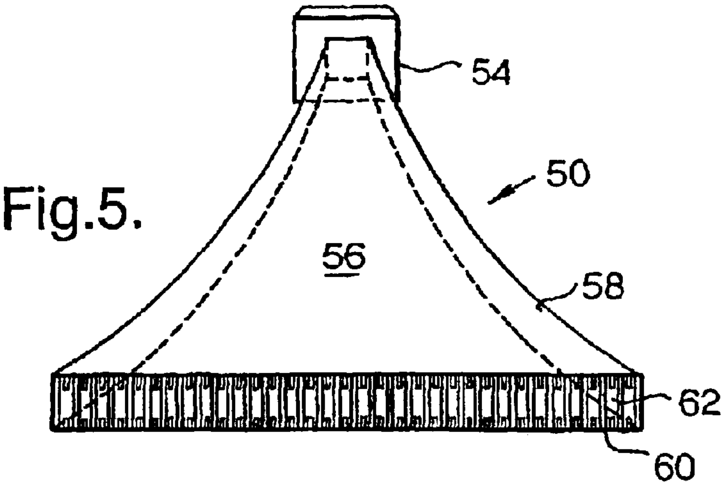
FIG. 5 is a diagrammatic perspective view of a first horn-type loudspeaker unit including an acoustic structure in accordance with the invention for providing a filter characteristic.

FIG. 5 shows a horn-type speaker 50 comprising a loudspeaker drive unit 52, a throat portion 54, and a flat horn 56 comprising an acoustic structure according to the invention providing a filter characteristic. The flat horn comprises two plates 58 and 60 sandwiching a single layer of apertured cells 62 as in the constructions of FIGS. 1 to 4 but in this instance the plates are shaped to flare like a horn and the loudspeaker drive unit is applied at an edge of the acoustic structure. The sides of the horn are closed by side walls 64 and 66 curved to follow the flare of the horn.

Figure 6:
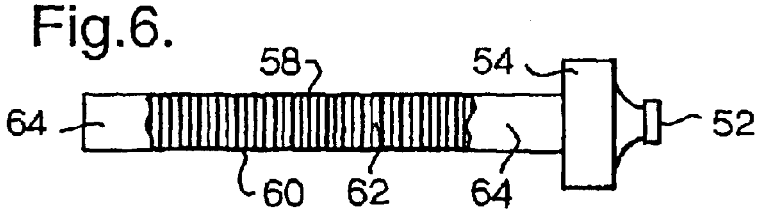
FIG. 6 is a diagrammatic side view corresponding to FIG. 5.

FIG. 6 gives a diagrammatic representation of the side of the horn with the associated side wall 66 cut away to reveal the internal structure.

Figure 8:
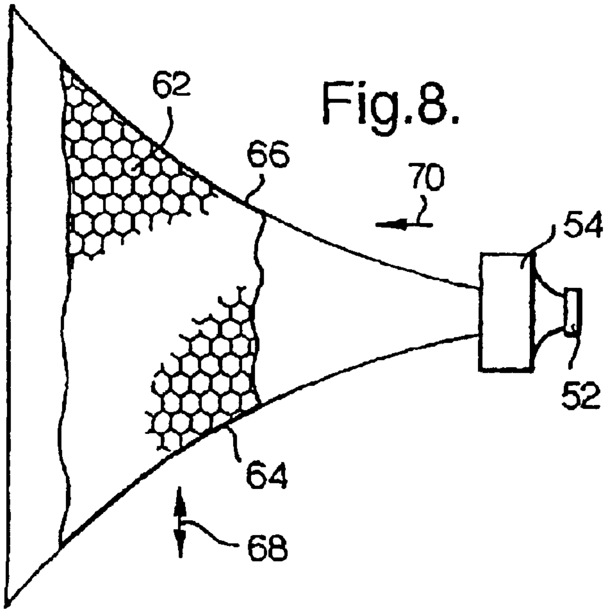
FIG. 8 is a diagrammatic cross-sectional plan view corresponding to FIG. 5.

FIG. 8 indicates that the apertures in the cells are arranged to permit sound transmission, as indicated by the arrow 70, along the axis of the horn, and crosswise to the axis as indicated by the double-headed arrow 66.

The use of an acoustic structure in accordance with the invention for providing a filter characteristic in a horn-type speaker provides an effective gain in the length of horn for a given output. It appears that the acoustic structure lowers the effective "m" or flare rate of the horn and hence the low frequency "cut-off" frequency is lowered for a given physical length and given flare rate.

Figure 7:
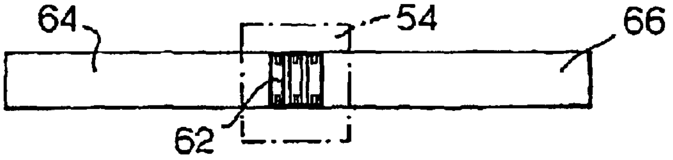
FIG. 7 is a diagrammatic cut-away end view corresponding to FIG. 5.
Figure 9:
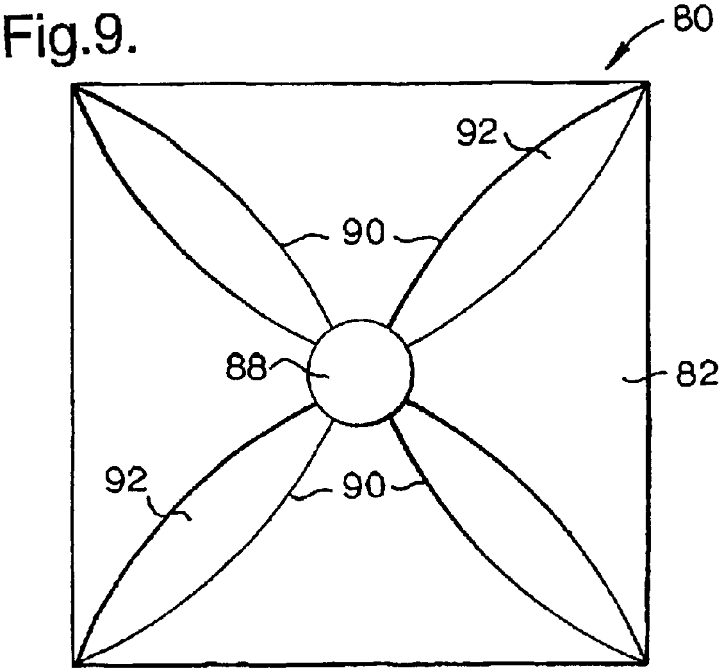
FIG. 9 is a diagrammatic plan view of a second horn-type loudspeaker unit including an acoustic structure in accordance with the invention for providing a filter characteristic.
Figure 10:
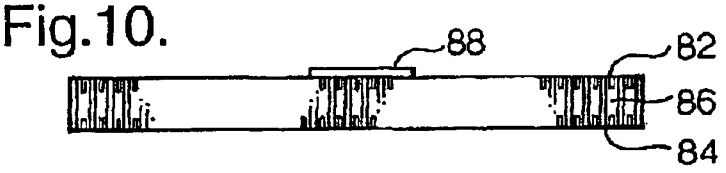
FIG. 10 is a diagrammatic end view corresponding to FIG. 9.

FIGS. 9 and 10 show another horn-type speaker comprising two square panels 82 and 84 sandwiching a single layer of apertured cells 86 as in the earlier figures providing a filter characteristic. In this instance, however, a loudspeaker drive unit 88 is mounted on one outer face to send sound into the interior of sandwich structure to emerge at the four sides of the square as if from four horns. The effect of four horns is achieved by internal walls 90 closing the sides of each horn in a generally similar manner to the side walls 64 and 66 in the construction of FIGS. 5, 6 and 7. If desired, the spaces 92 between the four horns can be acoustically coupled to the rear of the diaphragm of the loudspeaker driver 88 to provide a four-lobed rear chamber.

The structures described so far with reference to the drawings have all consisted of a single layer of cells between two outer panels. It is also possible to make an acoustic structure in accordance with the invention in the form of a "multi-layer sandwich", that is to say, a structure in which a multiplicity of panels are provided with a single layer of apertured cells between each adjacent pair of panels. Internal panels are provided with apertures, sized similarly to the apertures in the cells, to provide sound communication from layer to layer of the sandwich. A "block" of acoustic structure can be made in this way for fitting into an acoustic structure of known form. The loudspeaker units shown in FIGS. 1 to 10 could also be made in multi-layer instead of single layer form.

Figure 11:
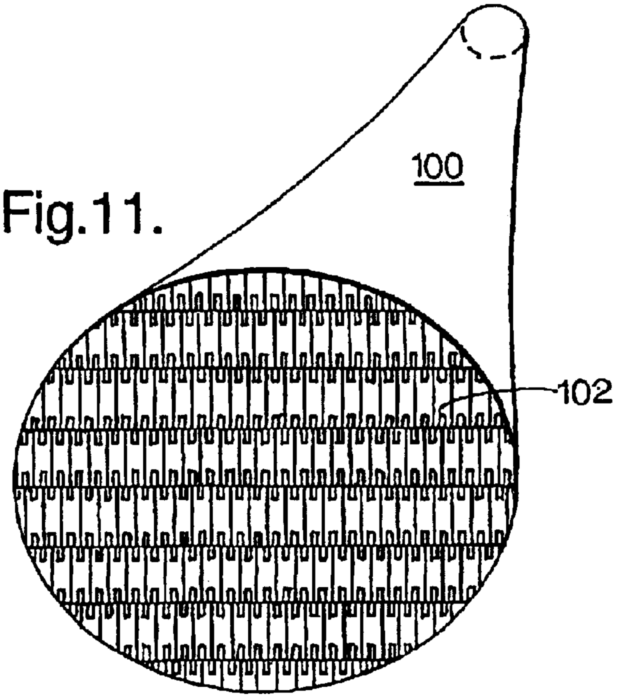
FIG. 11 is a diagrammatic perspective view of an acoustic horn including an acoustic structure in accordance with the invention for providing a filter characteristic.

FIG. 11 shows an acoustic horn 100 filled with a block 102 of multi-layer acoustic structure in accordance with the invention for providing a filter characteristic. The block is cut to shape and bonded into place in the horn. The acoustic horn 100 can be used, for example, as the front horn of a horn-type loudspeaker unit or as a rear tube in a speaker of the type described in GB 2 290 672A or in WO 98/51121.

In FIG. 11, the cells are shown out of alignment from one layer to the next as might arise in practical construction but one layer could equally well align with the next.

Many different materials can be used in making an acoustic structure in accordance with the invention.

For example, paper card, Aramid paper with phenolic coating, epoxy woven glass fabric, aluminium alloy, and epoxy woven carbon fabric can be used for making the cells. The papers and fabrics can, for example, be used in thicknesses of 0.05 to 0.5 millimetres and aluminium can, for example, be used in thicknesses of 0.025 to 0.15 millimetres.

For example, tempered hardwood veneer, aluminium alloy, carbon fibre epoxy resin composite panel, glass and steel can be used for making the panels with thicknesses, for example, of 0.5 to 13 millimetres.

An acoustic structure of the invention can be incorporated into virtually any acoustic apparatus of suitable size.

What is claimed is:

1. An acoustic structure comprising:

a first, rigid panel, a second, rigid panel aligned in spaced, substantially parallel, relationship with the first panel, a multiplicity of partition walls running transverse to the plan s of the panels and dividing the interior space of the acoustic structure into a single layer of cells bounded at one face by the inside of the first panel and bounded at the opposite face by the inside of the second panel, the partition walls being bonded at the one face to the inside of the first panel and at the opposite ace to the inside of the second panel, and a multiplicity of apertures in the partition walls providing communication between adjacent cells of the single layer of cells, and in which:

the cells each have a cross-sectional area parallel to the panels in the range 0.25 to 10 $cm^2$, the apertures each have a cross-sectional area of at least 0.04 $cm^2$, and at least 55% of the wall between a cell and an adjoining cell is imperforate.

2. A structure as claimed in claim 1, wherein the spacing of the first and second panels is selected from the group consisting of the range 10 to 50 millimetres, the range 15 to 35 millimetres, and the range 20 to 30 millimetres.

3. A structure as claimed in claim 1, wherein the cells each have a cross-sectional area selected from the group consisting of the range 0.5 to 4 $cm^2$, the range 0.6 to 2 $cm^2$, and range 0.8 to 1.5 $cm^2$.

4. A structure as claimed in claim 1, wherein the apertures each have a cross-sectional area selected from the group consisting of at least 0.1 $cm^2$, and the range 0.15 to 0.25 $cm^2$.

5. A structure as claimed in claim 1, wherein the percentage of the wall between a cell and an adjoining cell which is imperforate is selected from the group consisting of at least 60%, and at least 70%.

6. A structure as claimed claim 1, wherein the diameter of the cells is selected from the group consisting of between 15 and 50 millimetres, and between 20 and 30 millimetres.

7. A structure as claimed in claim 1, wherein sound absorbent material is provided within some or all of the cells.

8. A structure as claimed in claim 1, wherein said structure is selected from the group consisting of a horn-type loudspeaker unit, a labyrinth-type loudspeaker unit, and a flat panel loudspeaker system.

9. A structure as claimed in claim 1, wherein at least three of said panels in spaced, substantially parallel relationship are provided, there being a respective single layer of cells between each adjacent pair of panels, the or each panel that lies between two adjacent layers of cells including a multiplicity of apertures providing communication between cells of the adjacent layers of cells, the number of flat panels being selected from the group consisting of 2, 3, 4, 4 or more, and 5 or more panels.

10. A loudspeaker system comprising:

a first, rigid panel, a second, rigid panel aligned in spaced, substantially parallel, relationship with the first panel, a multiplicity of partition walls running transverse to the planes of the panels and dividing the interior space of the loudspeaker system into a single layer of cells bounded at one face by the inside of the first panel and bounded at the opposite face by the inside of the second panel, the partition walls being bonded at the one face to the inside of the first panel and at the opposite face to the inside of the second panel, a multiplicity of apertures in the partition walls providing communication between adjacent cells of the single layer of cells, one of said panels forming the front of the loudspeaker system and having an opening therein for mounting a loudspeaker drive unit, a peripheral wall running about the periphery of the structure to enclose the space within the structure, and a loudspeaker drive unit mounted in the said opening, and wherein the spacing of the first and second panels is in the range 20 to 50 millimetres the cells each have a cross-sectional area in the range 0.25 to 10 $cm^2$, at least 70% of the wall between a cell and an adjoining cell is imperforate. and the partition walls are less than one tenth the thickness of the panels.

11. A loudspeaker system comprising:

a first, rigid panel, a second, rigid panel aligned in spaced, substantially parallel, relationship with the first panel, a multiplicity of partition walls running transverse to the planes of the panels and dividing the interior space of the loudspeaker system into a single layer of cells bounded at one face by the inside of the first panel and bounded the opposite face by the inside of the second panel, the partition walls being bonded at the one face to the inside of the first panel and at the opposite face to the inside of the second panel, a multiplicity of apertures in the partition walls providing communication between adjacent cells of the single layer of cells.

one of said panels forming the front of the loudspeaker system and having an opening therein for mounting a loudspeaker drive unit, a peripheral wall running about the periphery of the structure to enclose the space within he structure, and a loudspeaker drive unit mounted in the paid opening wherein:

the cells each have a cross-sectional area parallel to the panels in the range 0.25 to 10 $cm^2$, the apertures each have a cross-sectional area of at least 0.04 cm2, and at least 55% of the wall between a cell and an adjoining cell is imperforate.

12. A loudspeaker system as claimed in claim 10, wherein the apertures are in the form of slots at the edges of the partition walls.

13. A loudspeaker system as claimed in claim 10, wherein each cell has two walls parallel to each other defined by parts the partition walls, and apertures are provided in the said two walls parallel to each other.

14. A loudspeaker system as claimed in claim 10, wherein the apertures are arranged in pairs, one aperture of each pair being adjacent the first panel and the other being adjacent the second panel.

15. A loudspeaker system as claimed in claim 10, wherein the arrangement of the apertures is non-uniform.

16. A loudspeaker system as claimed in claim 10, wherein the partition walls are formed by a multiplicity of inter-connected lamellae expanded into a network of cells.

17. A loudspeaker system comprising:

a first, rigid panel, a second, rigid panel aligned in spaced, substantially parallel, relationship with the first panel, a multiplicity of partition walls running transverse to the places of the panels and dividing the interior space of the loudspeaker system into a single layer of cells bounded at one face by the inside of the first panel and bounded at the opposite face by the inside of the second panel, the partition wall being bonded at the one face to the inside of the first panel and at the opposite face to the inside of the second panel, a multiplicity of apertures in the partition walls providing communication between adjacent cells of the single layer of cells, one of said panels forming the front of the enclosure and having an opening therein for mounting a loudspeaker drive unit, a peripheral wall running about the periphery of the structure to enclose the space within the structure, and a loudspeaker drive unit mounted in the said opening and wherein the spacing of the first and second panels is in the range 10 to 50 millimetres.

the cells each have a cross-sectional area in the range 0.5 to $cm^2$, at least 60% of the wall between a cell and an adjoining cell is imperforate, and the partition walls are less than one tenth the thickness of the panels.

18. A loudspeaker system as claimed in claim 17, wherein elements selected from the group consisting of the partition walls the panels, and the partition walls and the panels are made of a material having a Young's modulus greater than 50 GPa.

19. A loudspeaker system as claimed in claim 17, wherein the shape of the cells is selected from the group consisting of polygonal and hexagonal.

20. A loudspeaker system as claimed in claim 17, wherein the partition walls are adhesively bonded to the panels by means of an adhesive selected from the group consisting of an adhesive having low resilience when set, and an epoxy resin adhesive.

21. The loudspeaker system as claimed in claim 10, wherein he cells each have a cross-sectional area up to 4 $cm^2$.

22. The loudspeaker system as claimed in claim 11, wherein the cells each have a cross-sectional area up to 4 $cm^2$.

* * * * *